United States Patent
Anderson et al.

[19]

[11] Patent Number: 5,966,047
[45] Date of Patent: Oct. 12, 1999

[54] PROGRAMMABLE ANALOG ARRAY AND METHOD

[75] Inventors: David J. Anderson, Scottsdale; Danny A. Bersch, Gilbert, both of Ariz.

[73] Assignee: Motorola, Inc., Schaumburg, Ill.

[21] Appl. No.: 08/826,179

[22] Filed: Mar. 27, 1997

[51] Int. Cl.⁶ .............................. H03K 3/26; H01L 25/00
[52] U.S. Cl. .......................... 327/565; 327/336; 327/337
[58] Field of Search .................................. 327/564, 565, 327/336, 337, 345, 554; 257/532, 534; 438/396

[56] References Cited

U.S. PATENT DOCUMENTS

| | | | |
|---|---|---|---|
| 5,196,740 | 3/1993 | Austin | 327/566 |
| 5,245,646 | 9/1993 | Jackson et al. | 377/2 |
| 5,322,438 | 6/1994 | McNutt et al. | 437/51 |
| 5,635,421 | 6/1997 | Ting | 438/396 |
| 5,691,664 | 11/1997 | Anderson et al. | 327/565 |

*Primary Examiner*—Tuan T. Lam
*Attorney, Agent, or Firm*—Robert D. Atkins; Robert F. Hightower; Anthony M. Martinez

[57] ABSTRACT

A system for laying out a capacitor array (400) implements a programmable capacitor (33–39) whose operation is controlled with a binary control word. A programmable capacitance is produced by coupling binary weighted, switchable capacitors (101–107) between terminals (51, 52) of the programmable capacitor. The capacitor array includes two or more unit capacitors (101, 103) of unequal areas. The other capacitors in the array are derived by interconnecting multiple capacitors that match one of the unit capacitors. Die area is reduced while accuracy is maintained by controlling the larger unit capacitor with the least significant bit of the binary control word whenever possible and using the smaller unit capacitor only as a trim capacitor.

11 Claims, 2 Drawing Sheets

PROGRAMMABLE ANALOG ARRAY AND METHOD

BACKGROUND OF THE INVENTION

The present invention relates in general to integrated circuits and, more particularly, to programmable analog arrays.

Programmable analog arrays are integrated circuits that include a plurality of programmable analog cells that perform analog operations such as amplifying, filtering, etc., on analog signals. The analog signals are transferred among the programmable analog cells on interconnect paths formed in routing channels between adjacent cells.

The analog operations are executed by active circuits such as amplifiers or comparators typically controlled by ratios of programmable capacitors. Each programmable capacitor includes an array of capacitors coupled in series with analog switching devices such as transmission gates that couple the capacitors to the active circuit. The switching devices are enabled by binary control words stored in memory to produce proportional capacitances that control the analog operations.

Prior art switchable capacitor arrays include a unit capacitor that produces a minimum capacitance corresponding to a least-significant bit of the controlling binary word. Higher order capacitors are derived by interconnecting matching sets of individual unit capacitors to produce a desired capacitance value. For example, a third-order capacitor is implemented as eight individual unit capacitors which are interconnected to form a single capacitor whose nominal capacitance is $2^3=8$ times the unit capacitance.

A problem with prior art programmable analog arrays is the large amount of die area consumed by the binary weighted capacitor arrays. A large number of unit capacitors is needed for implementing even relatively low resolutions of programmable capacitance. For example, an eight-bit binary word is used to control an array comprising $2^8-1=255$ unit capacitors. Moreover, several such programmable capacitor arrays may be used for controlling the operation of each active circuit.

Hence, there is a need for a circuit and method for executing analog operations with an active circuit controlled by an array of switched capacitors in a reduced amount of die area.

DETAILED DESCRIPTION OF THE DRAWINGS

Figure 1:
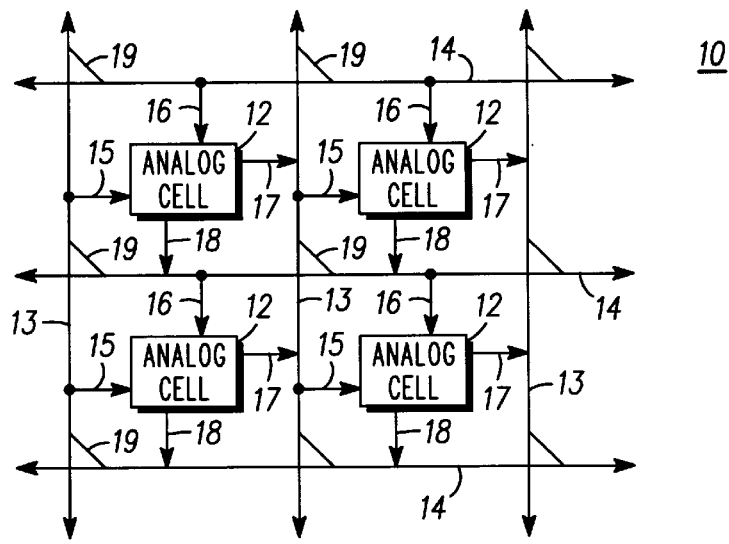
FIG. 1 is a block diagram of a programmable analog array.

FIG. 1 is a block diagram of a programmable analog array 10 in an integrated circuit configuration. Analog array 10 includes a plurality of programmable analog cells 12 arranged along a plurality of interconnect channels that form a switching network which includes bus lines 13 and 14 for routing analog signals. Input and output signals are transferred between analog cells 12 and buses 13 and 14 by means of analog switching devices such as transmission gates through which analog signals can be transferred with little or no distortion. Control over the switching devices is provided by digital signals that may be stored in a memory such as random access memory (RAM) or read-only memory included in the cell. Alternatively, a centralized memory array can be used to control the switching devices in all of the analog cells 12. As a further alternative, external memory can be used if provision is made for routing the binary control signals to individual analog cells 12. As yet a further alternative, control over the switching devices may be directly provided by other digital circuitry instead of a memory array. Signal routing between bus 13 and bus 14 is provided by switching devices 19.

In the figures, elements having the same reference number provide similar functions.

Figure 2:
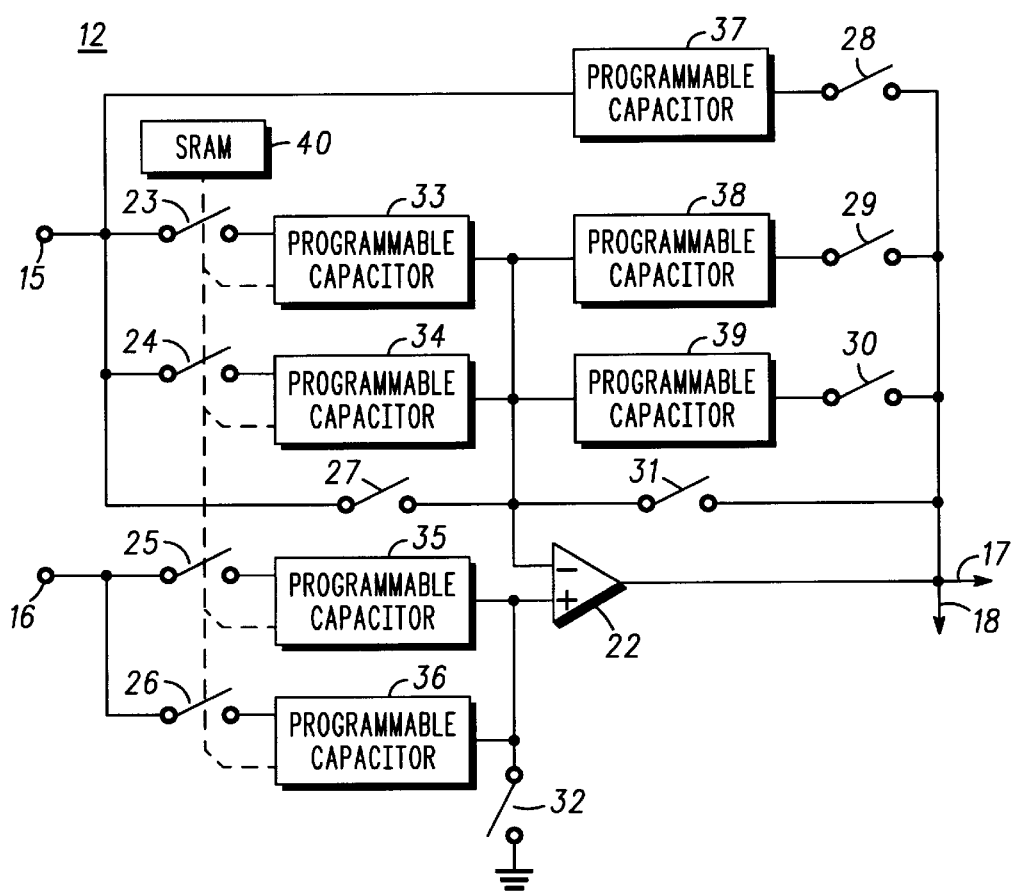
FIG. 2 is a schematic diagram of a programmable analog cell.

FIG. 2 is a schematic diagram of a programmable analog cell 12 including an active circuit 22, switches 23–32, programmable capacitors 33–39, and a static random access memory (SRAM) 40. Input signals are received on input terminals 15 and 16 and output signals are produced on output terminals 17 and 18. Output terminals 17 and 18 are shown as connected together to drive horizontal and vertical conductors 13 and 14. In an alternative embodiment, output terminals 17 and 18 could be isolated such that active circuit 22 drives output terminal 17 and an another active circuit included in programmable analog cell 12 drives output terminal 18.

Active circuit 22 is shown as an amplifier having inverting and non-inverting inputs and an output. The open loop gain of amplifier 22 is typically 10,000, but the closed loop gain is typically constrained to be less than 35 to ensure adequate closed loop bandwidth and stability.

The absolute capacitance values of programmable capacitors 33–39 are not well controlled in integrated circuit fabrication processes. However, a high degree of matching accuracy can be attained if programmable capacitors 33–39 are carefully laid out on the die. Such matching accuracy results in a given binary control word producing substantially equal capacitances when applied to each of the programmable capacitors 33–39. For this reason, operations of active circuit 22 are preferably controlled using ratios of programmable capacitances whenever possible. For example, if it is desired to operate amplifier 22 with a closed loop gain of 35/32, a binary control word "35" is applied to control programmable capacitor 39 and a binary control word "32" is applied to control programmable capacitor 33. The resulting capacitance ratio is 35/32.

Analog cell 12 can also include comparators and other types of active circuits, and can include more than one active circuits of the same type. For example, a single cell can incorporate several amplifiers controlled by programmable capacitors 33–39 to operate as an active filter. Active circuit 22 typically includes an output buffer stage (not shown) for driving the capacitances of programmable capacitors 37–39 and the load capacitances of terminals 17 and 18.

SRAM 40 comprises memory storage for controlling the operation of switches 23–32 and switches included in programmable capacitors 33–39. To simplify the figure, such control is indicated by the dotted line from SRAM 40 to switches 23–26 and programmable capacitors 33–36. Switches 23–26 and programmable capacitors 33–36 can alternatively be controlled by other types of memory, such as read only memory, or with combinational logic.

Programmable capacitors 33–39 include an array of switchable capacitors that are binary weighted such that smaller switchable capacitors can be controlled by least significant bits (LSBs) and larger switchable capacitors controlled by most significant bits (MSBs) in a binary control word from SRAM 40. Hence, the total capacitance of programmable capacitor 33 is proportional to a binary control word. For example, assume a unit capacitor in programmable capacitor 33 produces 0.1 picofarads of capacitance and the control word represents the binary equivalent of 20. The control word enables the appropriate switches within programmable capacitor 33 to produce a capacitance $C_{TOT}$ between terminals 51 and 52 of $C_{TOT}$=20*(0.1 picofarads)=2.0 picofarads.

It should be noted that programmable analog cell 12 can alternatively be implemented with programmable elements that include passive elements other than switchable capacitors, such as programmable resistors comprising switchable resistors that have binary or other weightings.

Figure 3:
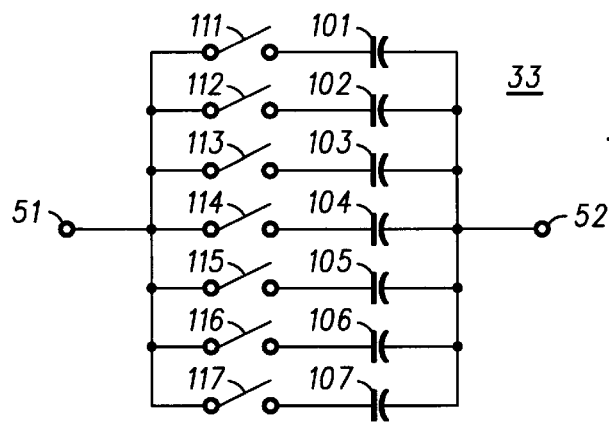
FIG. 3 is a schematic diagram of programmable capacitor.

FIG. 3 is a schematic diagram of programmable capacitor 33, including capacitors 101–107 that are switchably coupled to terminals 51 and 52 by means of switches 111–117 for operating as switchable capacitors. To minimize parasitic loading of node 52, additional switches can be added in series with capacitors 101–107 for isolation.

Capacitors 101–107 are binary weighted with capacitor 101 providing the smallest capacitance $C_{101}$ and capacitor 107 providing the largest capacitance. As an example, assume $C_{101}$=0.1 picofarads. Capacitors 102–107 have nominal capacitance which are binary multiples of $C_{101}$ as shown in Table 1.

TABLE 1

| CAPACITOR | WEIGHT | CAPACITANCE VALUE |
| --- | --- | --- |
| 101 | $2^0 * C_{101}$ | 0.1 picofarads |
| 102 | $2^1 * C_{101}$ | 0.2 picofarads |
| 103 | $2^2 * C_{101}$ | 0.4 picofarads |
| 104 | $2^3 * C_{101}$ | 0.8 picofarads |
| 105 | $2^4 * C_{101}$ | 1.6 picofarads |
| 106 | $2^5 * C_{101}$ | 3.2 picofarads |
| 107 | $2^6 * C_{101}$ | 6.4 picofarads |

By enabling switches 111–117 in various combinations, programmable capacitor 33 can provide a digitally programmable capacitance ranging from 0.0 picofarads (all switches open) to 12.7 picofarads (all switches closed) in $C_{101}$=0.1 picofarad increments. In order to provide an accurate monotonic correspondence between a binary control word and the programmable capacitance, capacitors 101–107 are laid out to achieve a high degree of matching with each other. However, such matching can substantially increase the die area needed for programmable capacitor 33.

Figure 4:
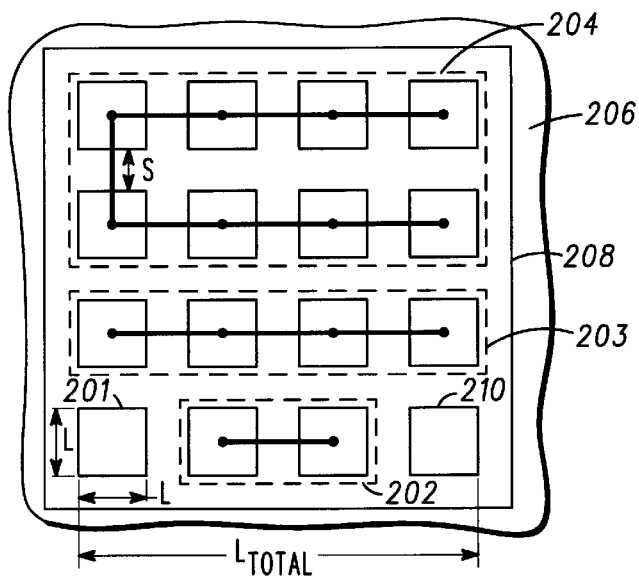
FIG. 4 is a top view of a prior art capacitor array.

FIG. 4 is a top view of a prior art capacitor array 200 including binary weighted capacitors 201–204 as laid out on a semiconductor substrate 206. Capacitors 201–204 are controlled by analog switching devices (not shown) to operate as switchable capacitors. Accordingly, capacitors 201–204 are similar to capacitors 101–104 shown in FIG. 3.

A conductive region 208 is formed on substrate 206 to provide a common plate for capacitors 201–204. Conductive region 208 is typically formed by depositing doped polysilicon on substrate 206, but alternatively can be implemented as a doped region in substrate 206.

Capacitor 201 functions as a unit capacitor such that capacitors 202–204 are derived from capacitor 201 by interconnecting an appropriate number of separate unit capacitors having an area matching that of capacitor 201. That is, capacitor 202 is formed by connecting two unit capacitors as shown, capacitor 203 is formed by connecting four unit capacitors as shown, and capacitor 204 is formed by connecting eight unit capacitors as shown. Each unit capacitor is formed from a continuous material. Unit capacitors are interconnected using a low parasitic interconnect layer such as a metal layer to form capacitors 202–204 as derivatives of capacitor 201. Thus, capacitors 202–204 are formed from separate unit capacitors that are interconnected with a material different from that which forms the individual unit capacitors. Capacitor 210 is not electrically connected in capacitor array 200, but often is used to improve the matching characteristics of adjacent capacitors 202 and 203. Alternatively, capacitor 210 can function as the unit capacitor of an adjacent capacitor array.

By forming capacitors 202–204 as composite capacitors derived from capacitor 201, matching is ensured among capacitors 201–204 over processing variations, preferably within ±0.5 LSB. As the number of capacitors in capacitor array 200 increases, matching becomes more stringent. For example, if capacitor 201 provides a unit capacitance $C_{201}$ and capacitor 203 has a nominal capacitance of $C_{203}$=4*$C_{201}$, then $C_{203}$ has a tolerance of ±0.5*$C_{201}$, or ±12.5%. Capacitor 204 has a nominal capacitance of $C_{204}$=8*$C_{201}$, so that a tolerance of ±0.5*$C_{201}$ for $C_{204}$ is equivalent to ±6.25% of a unit capacitance. Capacitor 201 should have an area sufficient to achieve matching within ±0.5 LSB.

Capacitor 201 is typically formed as a square or other regular polygon to maximize the area to perimeter ratio, which improves matching. Assuming capacitor 201 has a length L and the spacing S is the minimum lithographic distance between capacitors, the length $L_{200}$ and area $A_{200}$ of capacitor array 200 are given by $$L_{200} = 4L + 3S \quad (1)$$

$$A_{200} = L_{200}{}^2 = (4L+3S)_2 = 16L^2 + 12L*S + 9S^2 \quad (2)$$

For example, if unit capacitor 201 is formed as a square with 10.0 microns on a side and the spacing between adjacent capacitors is 4.0 microns, then $A_{200}$=(4*10+3*4)$^2$=52$^2$=2,704.0 square microns.

Figure 5:
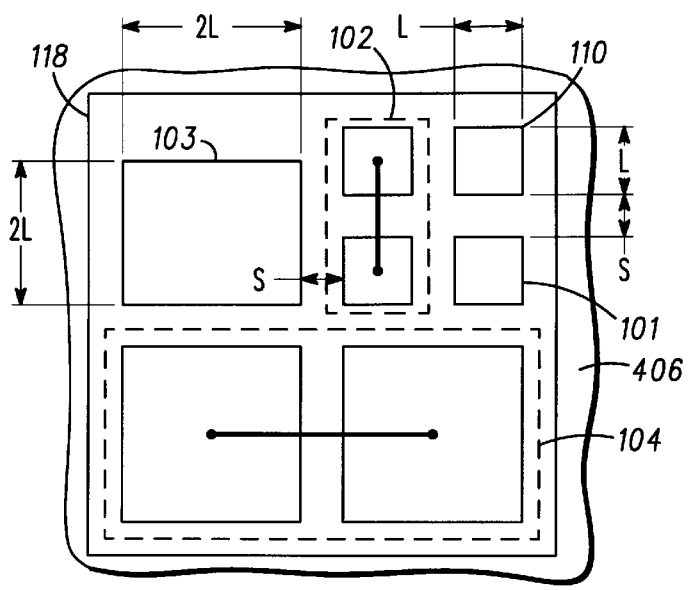
FIG. 5 is a top view of a capacitor array in accordance with the present invention.

FIG. 5 is a top view of capacitor array 400, including capacitors 101–104 formed on a semiconductor substrate 406 for implementation as an integrated circuit. In order to simplify the description, where programmable capacitor 33 is controlled by a seven-bit binary control word, capacitor array 400 comprises the portion of programmable capacitor 33 that is controlled by the four LSBs. Capacitors 101–104 are enabled by analog switching devices (not shown) to operate as switchable capacitors.

A conductive region 118 is formed on substrate 406 to provide a common plate of capacitors 101–104 which is coupled to node 52. Conductive region 118 is formed by depositing doped polysilicon on substrate 406, but can alternatively be implemented by introducing doping impurities in substrate 406 to form a doped region in substrate 406. Conductive region 118 preferably is doped to a high concentration to provide a low parasitic resistance for capacitors 101–104.

Capacitors 101–104 are formed as squares or other regular polygons to improve matching by maximizing the area-to-perimeter ratio. A dielectric region for each of the capacitors 101–104 is formed by depositing silicon dioxide or another insulating material on conductive region 118. The top plates are formed by depositing a layer of doped polysilicon or another conducting material such as aluminum on each of the dielectric regions.

Capacitor 101 has a top plate formed over a continuous area of capacitor 101 from a material such as polysilicon. Length L is selected to produce an area adequate to achieve matching accuracy within ±0.5 LSB. The area-to-perimeter ratio of capacitor 101 is $L^2/4L=L/4$.

Capacitor 102 is derived from capacitor 101 by using a low parasitic layer such as metal to interconnect two capacitors of length L that match capacitor 101 as shown. Hence, any processing variations will have substantially the same effect on capacitors 101 and 102. Capacitor 102 has the same area-to-perimeter ratio as capacitor 101, namely $2L^2/8L=L/4$.

In contrast to the prior art, the top plate of capacitor 103 is not formed from separate unit capacitors matched to capacitor 101 that are interconnected with a material different from that used to form capacitor 103. Instead, capacitor 103 is formed from a material such as polysilicon that is continuous over the area of capacitor 103. Capacitor 103 has a length 2L, and thus has a nominal area four times that of capacitor 101. The area-to-perimeter ratio of capacitor 103 is different from that of capacitor 101, namely $4L/8L=L^2/2$. Thus, capacitor array 400 includes capacitors 101 and 103 of unequal areas, both of which are formed from a continuous material.

Capacitor 104 is derived from capacitor 103 by using a low parasitic layer such as metal to interconnect two capacitors of length 2L that match capacitor 103 as shown. Capacitor 104 has the same area to perimeter ratio as capacitor 103, namely $8L^2/16L=L/2$. Because the area of capacitor 103 is greater than the area of capacitor 101, capacitor 104 more accurately matches capacitor 103 than capacitor 102 matches capacitor 101.

Capacitor 110 is not electrically coupled at the top plate, but is often included in capacitor array 400 to improve photolithographic dimension control of adjacent capacitors 101 and 102. Capacitor 110 can also function as a minimum-sized capacitor of an adjacent capacitor array. The distance S between adjacent capacitors 101–104 is determined by the photolithographic capabilities of the semiconductor process used in forming capacitor array 400.

Assuming capacitors 101–102 have length L, capacitors 103–104 have length 2L and capacitors 101–104 are separated by spacing S, as shown in FIG. 5, the length $L_{400}$ and area $A_{400}$ of capacitor array 400 are given by $$L_{400}=4L+2S \quad (3)$$

$$A_{400}=L_{400}^2=(4L^2S)^2=16L^28LS=4S^2 \quad (4)$$

For example, if length L=10.0 microns and spacing S=4.0 microns, then $A_{400}=(4*10+2*4)^2=52^2=2,304.0$ square microns. Comparing this result with that of the prior art, it can be seen that prior art capacitors array 200 is more than 17% larger than capacitor array 400 of the present invention.

It should be noted that the four binary weighted capacitors 101–104 provide four-bit capacitance resolution. The layout system of the present invention is readily extended to a larger number of bits to provide higher resolution, in which case the area saving advantages are even more pronounced. For example, capacitors 105–107 of programmable capacitor 33 can be derived by respectively interconnecting four, eight, and sixteen capacitors whose area is equal to capacitor 103. Thus, capacitor 103 functions as a unit capacitor with which capacitors 105–107 are well matched. By laying out capacitor array 400 using unit capacitors 101 and 103 having unequal areas, the reduction in die area over the prior art when a seven-bit capacitor array is laid out is even more substantial than with four-bit capacitor array 400 shown in FIG. 5.

As noted above, matching between capacitors improves as the respective area-to-perimeter ratios is increased. Capacitors having larger areas match better than capacitors with smaller areas due to proportionally better control over fringe capacitance and other parasitic effects which are proportional to the perimeters. To maximize matching accuracy, capacitor 103 is used as the primary unit capacitor and capacitor 101 is used as a secondary trim capacitor. In prior art capacitor array 200, the smallest capacitor 201 is controlled by a LSB of the binary control word. In the present invention, the two LSBs control capacitors 103 and 104 whenever such control can achieve the desired operation of active circuit 22. Only when a higher degree of precision is needed do the two LSBs control capacitors 101 and 102 instead of capacitors 103–104. By using primary and secondary unit capacitors 103 and 101 of unequal areas, overall matching accuracy improves while die area is decreased.

By way of illustration, refer to FIG. 2. Assume it is desired to control amplifier 22 to have a closed loop gain of 2.0, so that programmable capacitor 39 is programmed to produce twice the capacitance of programmable capacitor 33. In particular, capacitor 104 of programmable capacitor 39 is enabled by a second LSB to produce a capacitance $C_{104}=2C_{103}$. Capacitor 103 of programmable capacitor 33 is enabled by an LSB to produce a capacitance $C_{103}$. The gain $G=C_{104}/C_{103}=2*C_{103}/C_{103}=2.0$ has a higher degree of accuracy than a comparable gain using prior art capacitor array 200 because capacitors 103 and 104 have larger areas than capacitors 201 and 202.

As noted above, the matching between capacitor 101 and its derivatives (e.g., capacitor 102) is less accurate than the matching between capacitor 103 and its derivatives (e.g., capacitors 104–107). In addition, capacitors 101 and 102 are not as well matched with capacitors 103–107. Nevertheless, capacitor array 400 produces greater overall matching accuracy than the prior art even when capacitors 101 and 102 are used in combination with capacitors 103–107.

For example, assume that capacitors 101 and 103 provide capacitances $C_{101}$ and $C_{103}$, respectively. Assume the ratio $R_{CAP}=C_{101}/C_{103}$ has a lower matching accuracy due to the matching of small capacitor 101 to large capacitor 103. Further assume that it is desired to program programmable capacitors 39 and 33 to operate amplifier 22 with a closed loop gain of 127/64. In programmable capacitor 39, capacitors 101–107 are enabled to produce a capacitance $$C_{39}=(2^0+2^1)C_{101}+(2^0+2^1+2^2+2^3+2^4)C_{103}=3C_{101}+31C_{103} \quad (5)$$

In programmable capacitor 33, capacitor 107 is enabled to produce a capacitance $$C_{33}=2^4C_{103}=16C_{103} \quad (6)$$

The closed loop gain G of amplifier 22 is given by $$\begin{aligned}G = C_{39}/C_{33} &= (3C_{101}+31C_{103})/16C_{103} \quad (7)\\ &= (31C_{103})/(16C_{103})+(3C_{101})/(16C_{103})\\ &= 31/16+3R_{CAP}/16\end{aligned}$$

In this example, the ratio $31C_{103}/16C_{103}$ has a high level of accuracy because the ratio is determined by capacitors matched to capacitor 103. $R_{CAP}$ has a lower accuracy, but its effect on gain G is reduced by a factor of 3/16 as shown in equation (7).

To summarize, the present invention provides a scheme for laying out a capacitor array for digitally controlling analog operations executed by active circuits. Control is provided by a programmable capacitor that produces a programmable capacitance by switchably coupling binary weighted capacitors in the capacitor array to the active circuits. The capacitor array includes two or more unit capacitors formed over unequal areas. Other capacitors in the array are derived by interconnecting a plurality of capacitors that match one of the unit capacitors. The layout scheme reduces die area without sacrificing accuracy because the larger unit capacitor and its derivatives are used to form the programmable capacitor whenever possible. The smaller unit capacitors are used only to make finer capacitance adjustments, so their lower matching accuracy is reduced by their portion of the total programmable capacitance. Hence, the lower accuracy of the smaller unit capacitor is reduced in relation to the total capacitance. The layout scheme of the present invention can be used with other passive components such as resistors to form alternate types of programmable elements such as programmable resistors.

What is claimed is:

1. A programmable analog cell, comprising:

an active circuit; and a first programmable element coupled between a first node of the programmable analog cell and an input of the active circuit or between the input of the active circuit and an output of the active circuit, and including a first common plate and first and second passive elements that are switchably coupled between first and second terminals of the first programmable element, where the first passive element includes a single top plate continuous over a first portion of the first common plate and the second passive element includes a single top plate continuous over a second portion of the first common plate and where an area of the single top plate of the first passive element is unequal to an area of the single top plate of the second passive element.

2. The programmable analog cell of claim 1, further comprising a second programmable element coupled between the first node of the programmable analog cell and the input of the active circuit or between the input and the output of the active circuit, and including a second common plate and third and fourth passive elements that are switchably coupled between first and second terminals of the second programmable element, where the third passive element includes a top plate continuous over a first portion of the second common plate and the fourth passive element includes a top plate continuous over a second portion of the second common plate and where an area of the top plate of the third passive element is equal to the area of the single top plate of the first passive element and an area of the top plate of the fourth passive element is equal to the area of the single top plate of the second passive element.

3. A programmable element, comprising:

a common plate;

a first passive element including a top plate continuous over a first portion of the common plate, where the first passive element is switchably coupled between first and second terminals of the programmable element; and a second passive element including a top plate continuous over a second portion of the common plate, where the second passive element is switchably coupled between the first and second terminals of the programmable element and where an area of the top plate of the first passive element is unequal to an area of the top plate of the second passive element.

4. The programmable element of claim 3, wherein the first passive element includes a first capacitor providing a first capacitance proportional to the area of the top plate of the first passive element, the second passive element comprises a second capacitor providing a second capacitance proportional to the area of the top plate of the second passive element, and the value of the programmable element represents a sum of the first and second capacitances.

5. The programmable element of claim 4, further comprising:

a first switch that is coupled in series with the first capacitor for developing the first capacitance across the first and second terminals of the programmable element; and a second switch that is coupled in series with the second capacitor for developing the second capacitance across the first and second terminals of the programmable element.

6. The programmable element of claim 4, wherein a ratio of the first capacitance to the second capacitance is a multiple of two.

7. The programmable element of claim 6, wherein the top plate of the first passive element and the top plate of the second passive element each include polysilicon.

8. A method for programming a programmable analog cell, comprising the steps of:

forming a conductive region;

forming a first unit capacitor having a top plate that is continuous over a first portion of the conductive region;

forming a second unit capacitor having a top plate that is continuous over a second portion of the conductive region, where the first and second portions of the conductive region are unequal;

switchably coupling the first unit capacitor between first and second terminals of the programmable analog cell; and switchably coupling the second unit capacitor between the first and second terminals of the programmable analog cell.

9. The method of claim 8, further comprising a step of summing a capacitance of the first unit capacitor and a capacitance of the second unit capacitor to produce a programmable capacitance represented by the value of the programmable analog cell.

10. A capacitor array having a first terminal and a second terminal, comprising:

first and second unit capacitors coupled between the first and second terminals of the capacitor array;

where the first and second unit capacitors each has a top plate that is continuously formed over a common plate; and where an area-to-perimeter ratio of the top plate of the first unit capacitor is unequal to an area-to-perimeter ratio of the top plate of the second unit capacitor.

11. The capacitor array of claim 10, further comprising:

first and second passive elements coupled between the first and second terminals of the capacitor array;

where the first passive element includes first and second top plates each having areas equal to an area of the top plate of the first unit capacitor; and where the second passive element includes first and second top plates each having areas equal to an area of the top plate of the second unit capacitor.

* * * * *